United States Patent [19]

Jarry et al.

[11] 4,366,009
[45] Dec. 28, 1982

[54] METHOD OF MANUFACTURING SEMICONDUCTOR STRUCTURES BY EPITAXIAL GROWTH FROM THE LIQUID PHASE

[75] Inventors: Philippe Jarry, Sucy en Brie; Pierre Guittard, Montlhery; Alphonse Ducarre, Ste-Genevieve des Bois, all of France

[73] Assignee: U.S. Philips Corporation, Tarrytown, N.Y.

[21] Appl. No.: 213,982

[22] Filed: Dec. 8, 1980

[30] Foreign Application Priority Data

Dec. 7, 1979 [FR] France .................. 79 30103

[51] Int. Cl.³ .................................. H01L 21/208
[52] U.S. Cl. .................... 148/171; 148/172; 156/638; 156/662
[58] Field of Search ............... 148/171, 172; 156/638, 156/662

[56] References Cited

U.S. PATENT DOCUMENTS

| | | | |
|---|---|---|---|
| 3,631,836 | 1/1972 | Jarvela et al. | 148/171 X |
| 3,783,825 | 1/1974 | Kobayasi et al. | 148/171 X |
| 3,909,317 | 9/1975 | Itoh et al. | 148/171 |
| 3,940,296 | 2/1976 | Oirschot et al. | 147/171 |
| 3,950,195 | 4/1976 | Rode et al. | 148/171 |
| 3,960,618 | 6/1976 | Kawamura et al. | 148/171 |
| 4,008,106 | 2/1977 | Gutierrez et al. | 148/172 |
| 4,028,148 | 6/1977 | Horikoshi | 148/171 |
| 4,178,195 | 12/1979 | Horvel et al. | 148/171 |

Primary Examiner—G. Ozaki
Attorney, Agent, or Firm—Ronald J. Meetin; Robert T. Mayer; Thomas A. Briody

[57] ABSTRACT

In manufacturing a semiconductor device by epitaxial growth from the liquid phase on a substrate of layers of gallium arsenide or gallium aluminum arsenide doped with elements such as germanium, the last growth melt is wiped off and the structure is cooled to a temperature from room temperature to 200° C. During cooling, the structure's upper surface is contacted with a liquid gallium melt in such a manner that the doping elements present in the few remaining drops of the last growth melt not removed by the wiping off are dissolved.

4 Claims, 3 Drawing Figures

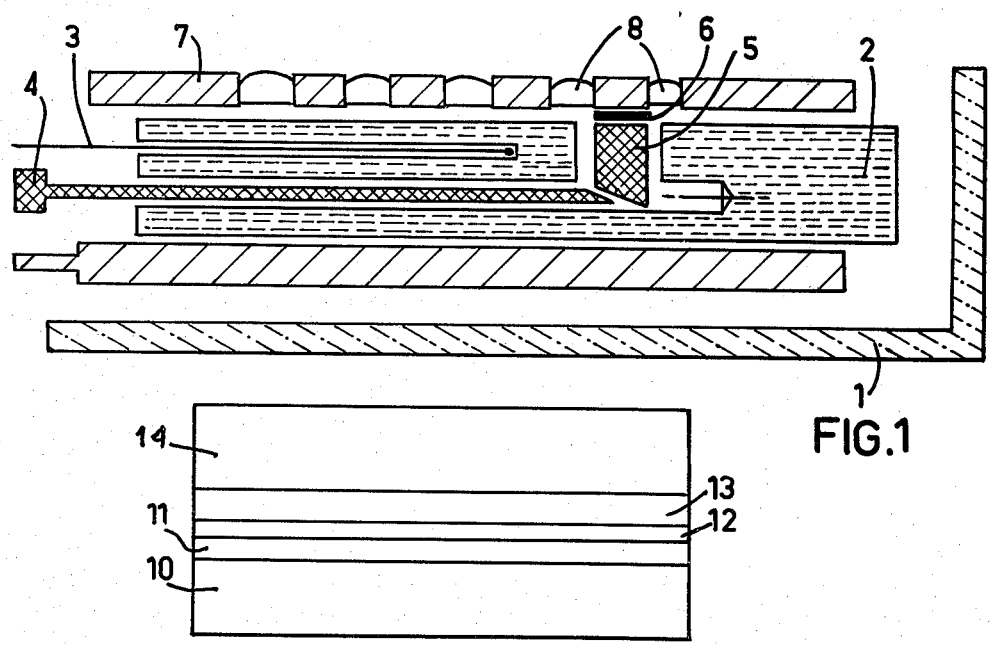
FIG.1
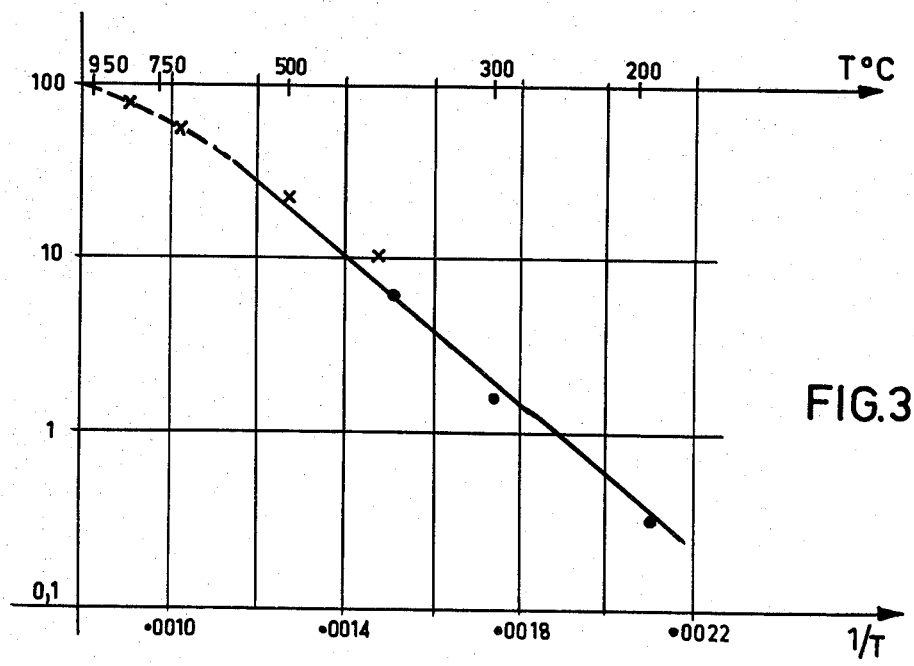
FIG.2
FIG.3

METHOD OF MANUFACTURING SEMICONDUCTOR STRUCTURES BY EPITAXIAL GROWTH FROM THE LIQUID PHASE

BACKGROUND OF THE INVENTION

The invention relates to a method of manufacturing a semiconductor device in which layers of gallium arsenide or gallium aluminum arsenide are grown on a substrate from the liquid phase, which layers are doped by means of elements such as germanium, the last growth solution is then wiped off and finally the resulting structure is cooled to room temperature in the epitaxy furnace. The invention also relates to semiconductor devices obtained by using said method. The invention is applied in the field of electronics, more in particular for the manufacture laser diodes having a double heterostructure, of electroluminescent diodes and semitransparent photocathodes.

During the manufacture of such structures, according to the known method, the formation of pyramids of the doping elements (germanium) results from a poor wiping off of the last growth solution, which crystallizes during the cooling in the epitaxy furnace. The epitaxy surface then shows large defects which can be removed with difficulty by subsequent known treatments and which deteriorate the operation of the resulting optoelectronic devices.

SUMMARY OF THE INVENTION

It is the object of the invention to reduce the above-mentioned disadvantages by counteracting the formation of said pyramids.

For that purpose, the method according to the invention is characterized in that during cooling the upper surface of the structure is contacted with a liquid gallium bath in such manner that the doping elements which are present in the few remaining drops of the last growth solution not removed by the wiping off are dissolved.

In this manner the substrate can be cooled to a temperature as low as possible and then taken out of the epitaxy furnace, after which the few remaining drops are wiped away from the epitaxial surface.

BRIEF DESCRIPTION OF THE DRAWINGS

The invention will now be described in greater detail with reference to the accompanying drawings.

FIG. 1 shows a part of an apparatus for the epitaxial growth from the liquid phase.

FIG. 2 shows a semiconductor device.

FIG. 3 shows the Ga-rich part of the diagram Ga-Ge phase.

DESCRIPTION OF THE PREFERRED EMBODIMENT

Liquid phase epitaxy briefly consists of the deposition of a layer of material on a solid substrate from a growth solution which comprises the material which is to be deposited and which is contacted with the substrate and is allowed to cool. This growth method is known to those skilled in the art and reference might be made, for example, to the articles by Kressel and Nelson, entitled "Liquid Phase Epitaxy" in "Physics of Thin Film", volume 7, 1973, edited by Academic Press (New York and London).

The apparatus for carrying out such a method varies considerably according to the users, and one will be described which is used by Applicants and which is extremely suitable for the purpose of the present invention and which is described in an article of "Journal of Crystal Growth", 20, (1973) by van Oirschot and Nijman. Such an apparatus, as is shown in FIG. 1, consists of a boat 1 of quartz, which contains and projects a crucible 2 of graphite in which a first aperture is provided for a thermocouple 3 and a second aperture is provided in which a rod 4 extends the end of which is bevelled and with which a support 5 can be operated in the vertical direction on which support a substrate 6 is provided. A slide 7 also of graphite comprises several holes 8 which are filled with growth melts, for example, a first melt of GaAlAs, a second melt of GaAs, and a third melt of GaAlAs between which so-called wash melt may be provided the composition of which is nearly the same as the composition of the next melt and which is rapidly contacted with the substrate 6 so that an undesired material, for example aluminum, can be removed. Such an improvement is disclosed, for example in U.S. Pat. No. 3,909,317 filed on July 30, 1973.

The apparatus is placed in an epitaxy furnace the temperature of which is programmed in accordance with time in such manner that it is decreased by approximately 0.25° C. per minute, which implies that the temperature in such a furnace has to be controlled with even greater accuracy.

By using such a growth method by means of such an apparatus, various devices can be obtained—and even more in particular hetero-structures—for manufacturing various opto-electronic devices, for example lasers with double hetero-structure, electroluminescent diodes or semitransparent photocathodes. FIG. 2 describes such a photocathode by way of example. It consists, in the sequence of growth, of a substrate 10 on which a chemical barrier layer 11 has been deposited in a thickness of 10 μm of $Ga_{1-x}Al_xAs$ ($x \geq 0.40$), then an active layer 12 of GaAs in a thickness of approximately 6 μm and finally a passivation layer 13 of $Ga_{1-y}Al_yAs$ of approximately 15 μm thickness. According to the technology suitable for the manufacture of such a semitransparent photocathode, said structure is provided on sapphire 14 via a sealing glass comprising, for example, Ca, B, Al and Si, in accordance with French patent application No. 75.03.429 filed on Feb. 4, 1974. The substrate 10 of GaAs is then removed by chemical etching by means of a solution containing $NH_4OH$ and $H_2O_2$ and the chemical barrier layer 11 of GaAlAs is removed by means of a HF solution.

When using the prior art method, the structure shows surface defects on the last epitaxial layer, which defects are due in particular to a less thorough wiping off of the last growth melt which consists, for example, of gallium (Ga: 10 g), aluminum (Al: 40 mg), gallium arsenide (GaAs: 300 mg) and a dopant, for example germanium (Ge: 800 mg). The ultimate wiping is carried out by means of the slide 7. There will always be some amount of play between the slide and the crucible which may either be too small, in which case the surface of the substrate will be scratched, or too large, in which case the wiping off is incomplete. In general, drops of the melt liquid which have not been wiped off remain at the periphery and during cooling of the structure in the epitaxy furnace the germanium deposits and grows in the form of pyramids. Moreover it is very difficult, if not impossible, to remove the pyramids of germanium after deposition. The presence of said surface defects influences the quality of the opto-electronic device.

However, solutions have been suggested to reduce said disadvantage:

on the one hand, by chemical etching by means of various etching solutions, which is described in "Neueb aus der Technik", No. 3, June 1979, page 7, by Tijburg and Van Dongen.

on the other hand by the growth of an extra layer (termed in English "cosmetic layer"), which is then etched selectively, which is suggested by Kressel et al on page 188 of the above publication.

However, with larger doping ratios, for example, of approximately 10% germanium in gallium, these solutions are no longer satisfactory.

The method according to the invention of manufacturing such structures (or hetero-structures) by liquid phase epitaxy is characterized in that during cooling and at least prior to any growth of germanium pyramids, the grown structure is contacted with an extra solution, called "rinse-melt", which comprises liquid gallium in such manner and for a period of time of at least a few seconds to one minute, so as to reduce the concentration of dopant (germanium) in a ratio which may reach the hundredth part. Then the "rinse-melt" is wiped off in the same manner by means of the slide 7, but the non-removed drops comprise a smaller share of dopant (germanium). Cooling is then continued down to a suitable temperature which may be chosen between 200° C. and room temperature so that the structure can be removed from the epitaxy furnace. Then there is wiped off manually, for example, by means of cotton rods or any other suitable means. In this manner there is no deposit of germanium pyramids any longer, the surface of the structure is free from such defects and the opto-electronic qualities of the manufactured devices are clearly improved.

According to a preferential mode of realization, this "rinse-melt" comprises also the other components of the last grown layer in such contents to prevent any dissolution of this last grown layer. These contents can be calculated by means of the relevant phase diagram to reach the equilibrium between the solid and liquid phases.

The apparatus used for the growth is identical to that described above with the exception that it comprises an extra hole.

By means of the melting diagram of a growth solution Ga-Ge as shown in FIG. 3, the physical-chemical mechanism of the invention can be better understood and the purport thereof may be measured as a general means.

In fact, when a given solution of, for example, gallium-germanium, which comprises 10% germanium in gallium, is cooled crystallization occurs at approximately 450° C. In a diagram as shown in FIG. 3 a cooling with constant composition gives a horizontal displacement and the crystallization temperature is obtained at the point of intersection between the horizontal line and the melting curve. By contacting the structure with a "rinse-melt" solution containing only gallium, the share of germanium can be reduced in a proportion of one hundredth. We then have a lower horizontal line in the diagram (0.1%) and the crystallisation temperature is between 200° C. and the ambient temperature in accordance with the actual concentration of germanium. So, the structure may be cooled to a sufficiently low temperature so that it can be removed from the epitaxy furnace without any danger, to manually wipe off the last remaining drops.

It will be obvious to those skilled in the art that such an invention is not restricted to the above explained manufacture but that in equal manner it may be extended to other types of dopants and growth solutions.

What is claimed is:

1. A method of manufacturing a semiconductor device in which layers of gallium arsenide or gallium aluminum arsenide doped with doping elements such as germanium are grown from the liquid phase on a substrate in an epitaxy furnace, the last growth melt is wiped off, and the resulting structure is cooled down to a selected temperature in the furnace, characterized in that during cooling of the structure its upper surface is contacted with a liquid gallium melt in such a manner that the portion of the doping elements present in the remaining drops of the last growth melt that are not removed by the wiping off are dissolved.

2. A method as in claim 1 characterized in that the selected temperature is in the range of room temperature to 200° C.

3. A method as in claim 2 characterized in that the structure is removed from the furnace after having been cooled down to the selected temperature and the remaining drops are thereafter removed.

4. A method as in claim 1, 2 or 3 wherein the layers are grown by contacting the substrate successively with growth melts comprising the components of the layers while cooling the furnace.

* * * * *